(12) United States Patent (10) Patent No.: US 11,804,624 B2
Gottwald et al. (45) Date of Patent: Oct. 31, 2023

(54) BATTERY MODULE HAVING A PLURALITY OF BATTERY CELLS AND METHOD FOR PRODUCING SAME

(71) Applicant: Robert Bosch GmbH, Stuttgart (DE)

(72) Inventors: Frank Gottwald, Weissach (DE); Ralph Glemser, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 17/324,343

(22) Filed: May 19, 2021

(65) Prior Publication Data

US 2021/0367287 A1 Nov. 25, 2021

(30) Foreign Application Priority Data

May 20, 2020 (DE) .......................... 102020206339.7

(51) Int. Cl.
*H01M 10/653* (2014.01)
*H01M 50/543* (2021.01)
*H01M 10/052* (2010.01)
*H01M 10/655* (2014.01)
*H01M 50/296* (2021.01)
*H01M 50/209* (2021.01)
*H05K 7/20* (2006.01)
*H01M 50/20* (2021.01)

(52) U.S. Cl.
CPC ....... *H01M 10/653* (2015.04); *H01M 10/052* (2013.01); *H01M 10/655* (2015.04); *H01M 50/20* (2021.01); *H01M 50/209* (2021.01); *H01M 50/296* (2021.01); *H01M 50/543* (2021.01); *H05K 7/2039* (2013.01)

(58) Field of Classification Search
CPC . H01M 10/653; H01M 10/655; H01M 50/296
See application file for complete search history.

(56) References Cited

U.S. PATENT DOCUMENTS

2018/0326863 A1  11/2018  Soki et al.

FOREIGN PATENT DOCUMENTS

| DE | 102014001238 A1 | 8/2014 |
| DE | 102013218668 A1 | 3/2015 |
| DE | 102015208159 A1 | 11/2015 |
| DE | 102016203129 B3 | 5/2017 |
| DE | 102018110885 | * 11/2018 |
| WO | 2013138380 A2 | 9/2013 |

* cited by examiner

*Primary Examiner* — Jonathan Crepeau
(74) *Attorney, Agent, or Firm* — Michael Best & Friedrich LLP (57) ABSTRACT

A battery module having a plurality of battery cells (2), in particular lithium-ion battery cells (20), which are each electrically conductively interconnected with one another in series and/or in parallel, and a switching device (3), which has a first terminal (31) and a second terminal (32), wherein a first connecting element (41) of electrically conductive design electrically conductively connects the first terminal (31) to a voltage tap (5) of a battery cell (2, 21) arranged at an end and a second connecting element (42) of electrically conductive design electrically conductively connects the second terminal (32) to a voltage tap (6) of the battery module (1), wherein the first connecting element (41) and/or the second connecting element (42) are received in a thermally conductive manner in a receptacle (7, 71, 72) of the housing (10) of the battery module (1).

19 Claims, 7 Drawing Sheets

BATTERY MODULE HAVING A PLURALITY OF BATTERY CELLS AND METHOD FOR PRODUCING SAME

BACKGROUND

The invention proceeds from a battery module having a plurality of battery cells. The subject matter of the present invention is also a method for producing such a battery module.

It is known from the prior art that battery modules can consist of a plurality of individual battery cells, which can be electrically conductively interconnected with one another in series and/or in parallel so that the individual battery cells are connected together to form the battery module. Furthermore, such battery modules are connected together to form batteries or battery systems.

In addition, such battery modules often have switching devices such as, for example, a relay, which are usually intended to regulate a freedom from voltage at the positive pole of the battery module. Such switching devices therefore conduct the maximum current of the respective battery module and inherently generate a comparatively large amount of heat. It is known from the prior art to emit this heat that is to be emitted for example via a surface of the switching device or else of a current conductor, which electrically conductively connects the switching device to a battery cell, by means of convection to the ambient air of the battery module.

SUMMARY

A battery module having a plurality of battery cells affords the advantage that it is possible to remove heat from a switching device of the battery module in a reliable manner.

A battery module having a plurality of battery cells is provided for this purpose. The battery cells are in this case designed, in particular, as lithium-ion battery cells. Furthermore, the battery cells are each electrically conductively interconnected with one another in series and/or in parallel. To this end, the battery cells can each have a first voltage tap, in particular a positive voltage tap, and a second voltage tap, in particular a negative voltage tap, which are electrically conductively connected to one another by means of cell connectors, with the result that an electrically series and/or parallel interconnection is formed.

The battery module also comprises a switching device having a first terminal and having a second terminal. A first connecting element of electrically conductive design electrically conductively connects the first terminal to a voltage tap of a battery cell arranged at an end. In particular, the voltage tap of the battery cell arranged at an end is in this case a first voltage tap or positive voltage tap. A second connecting element of electrically conductive design electrically conductively connects the second terminal to a voltage tap of the battery module. In particular, the voltage tap of the battery module is in this case a positive voltage tap.

In this case, the first connecting element and/or the second connecting element are received in a thermally conductive manner in a receptacle of the housing of the battery module.

It should be noted at this point that, using an inventive embodiment of the battery module, heat can be removed reliably in particular also from the positive voltage tap of the battery cell arranged at an end, which undergoes comparatively high thermal loading.

Overall, it is therefore possible, even given comparatively high demands on the battery module, for example an average continuous current of 200 A or a maximum current of 600 A for 10 seconds, to provide reliable removal of heat from the switching device and the positive voltage tap of the battery cell arranged at an end. A maximum temperature at the positive voltage tap of the battery cell arranged at an end or the switching device can therefore be kept comparatively low and, in particular, the service life of the entire battery module can also be increased as a result.

A compensation material of thermally conductive design is furthermore expediently arranged in the receptacle. It should be noted at this point that the compensation material is also known as a thermal interface material (TIM). In particular, the compensation material can also be of electrically insulating design in order to form an electrical insulation. In particular, this material can preferably be selected from an epoxy or a silicon or a polyurethane (PU).

In particular, the compensation element can be received in the receptacle before arrangement of the first connecting element or the second connecting element. By inserting the first connecting element or the second connecting element, the compensation element can be distributed in the receptacle and thereby form a reliable transmission of heat. In particular, the compensation material is of elastically or plastically deformable design.

It is advantageous if the receptacle is arranged on a side surface of the housing of the battery module. In addition, it could also be advantageous if the receptacle is formed on a bottom surface of the housing of the battery module. It should be noted at this point that a bottom surface is intended to be understood as the underside of the battery module arranged at the bottom during use as intended. Accordingly, a side surface should be arranged perpendicular to the underside.

According to a preferred aspect of the invention, the receptacle comprises an opening. It should be noted at this point, in particular, that the opening is designed to insert the first connecting element and/or the second connecting element into the receptacle. In this case, the opening has a cross-sectional area, which is arranged perpendicular to the side surface or parallel to the bottom surface.

In the case of a receptacle formed on a side surface of the housing of the battery module, the cross-sectional area of the opening is thus formed perpendicular to the side surface. It should be noted at this point that, in the case of a receptacle formed on a side surface of the housing of the battery module, the opening is not arranged on a greatest side surface of the receptacle. In other words, this means that the receptacle has a comparatively small opening in comparison to the volume thereof. In particular, the opening has a rectangular shape, in which the length is a multiple greater than the width. The opening can of course also have an elliptical, oval or circular shape.

In addition, it should be noted at this point that, with respect to an arrangement of the first connecting element or the second connecting element in the receptacle, the first connecting element or the second connecting element is inserted into the receptacle along the side surface parallel to the side surface. In other words, this means that a receptacle formed on a side surface of the housing of the battery module is designed as a pouch.

In the case of a receptacle formed on a bottom surface of the housing of the battery module, the cross-sectional area of the opening is thus formed parallel to the bottom surface. It should be noted at this point that, in the case of a receptacle formed on a bottom surface of the housing of the battery module, the opening is arranged on a greatest side surface of the receptacle. In other words, this means that the receptacle has a comparatively large opening in comparison to the volume thereof. In particular, the opening has a rectangular shape, in which the length approximately corresponds to the width. In addition, it should be noted at this point that, with respect to an arrangement of the first connecting element or the second connecting element in the receptacle, the first connecting element or the second connecting element is inserted into the receptacle perpendicular to the bottom surface. In other words, this means that a receptacle formed on a bottom surface of the housing of the battery module is designed as a recess.

In the two mentioned embodiments of the receptacle, the first connecting element and/or the second connecting element can each be inserted into the battery module from above in a direction perpendicular to the bottom surface or parallel to the side surface. In particular, a preassembled structural group consisting of the switching device, the first connecting element and the second connecting element can be formed here, which is subsequently inserted into the battery module.

The first connecting element and the second connecting element are particularly preferably formed from a material selected from copper or aluminum or ceramic. This affords the advantage that particularly reliable heat dissipation on account of a comparatively high thermal conductivity can be provided.

It is expedient if the battery module furthermore comprises a holding element, which is arranged between the receptacle and the first connecting element or the second connecting element. In particular, the holding element can be formed from a polymeric material. It is particularly advantageous if the holding element is arranged in the receptacle on the first connecting element or on the second connecting element before arrangement of the first connecting element or the second connecting element. For example, the holding element can be connected to the first connecting element or to the second connecting element by way of clipping. It is also possible to injection-mold the holding element to the first connecting element or to the second connecting element. The holding element fulfills the particular aim of being able to space apart the first connecting element or the second connecting element from the receptacle so that electrical short circuits can be prevented. Furthermore, a defined spacing in which the compensation material is arranged can be formed thereby. The holding element serves, in particular, to form minimum spacings for air and creepage path requirements.

According to a preferred aspect of the invention, the switching device is arranged immediately adjacent to the battery cell arranged at an end. The battery cells are preferably designed in this case as prismatic battery cells. Prismatic battery cells usually have six side surfaces, wherein opposite side surfaces are each arranged substantially parallel to one another and are formed to be substantially the same size. Side surfaces that are arranged immediately adjacent to one another are in this case each arranged substantially at a right angle to one another. In this case, the battery cells are arranged in such a manner that they are preferably arranged adjacent to one another by way of their respective largest side surfaces in a longitudinal direction of the battery module. Here, the switching device is arranged, in particular, immediately adjacent to a largest side surface of a battery cell arranged at an end in the longitudinal direction. It should also be noted at this point that arranged at an end can also mean electrically arranged at an end. An arrangement at an end affords the advantage, in particular, that a short electrically conductive connection can be formed between the first terminal of the switching device and the voltage tap of the end battery cell.

It is particularly preferred if the housing of the battery module comprises a temperature-control element. For example, the battery module can to this end form a temperature-control space through which a temperature-control fluid can flow. The temperature-control element is preferably arranged here on an underside of the battery module. The temperature-control element can also be formed as a temperature-control plate, which can be arranged in addition to the housing. In particular, the housing of the battery module and/or the temperature-control element can preferably be formed from aluminum. Active cooling of the housing of the battery module can be formed as a result.

It is advantageous if the receptacle is arranged immediately adjacent to the temperature-control element. Heat can be transferred particularly effectively to the temperature-control element as a result. In particular, heat can thereby be transferred reliably to the temperature-control element by means of the first connecting element and the second connecting element.

The switch apparatus can be formed, for example, as semiconductor switches, which are also known as transistors, metal oxide semiconductor field-effect transistors (MOSFETs) or insulated-gate bipolar transistors (IGBTs). The switch apparatus is preferably a mechanical relay, in which a contact can be opened and closed by way of an electromagnetic force.

It is particularly advantageous that, using an inventive embodiment, in particular heat produced within the switching device during operation can be dissipated to the housing of the battery module by means of the first connecting element and the second connecting element via the respective receptacle. As a result, for example, the service life of the switching device can be increased and/or the switching device can be adapted to comparatively higher demands on the battery module, in particular with respect to the maximum current flow.

It should be noted at this point that the first terminal of the switching device and the first connecting element can also jointly be formed in one part and that the second terminal of the switching device and the second connecting element can also jointly be formed in one part.

The subject matter of the present invention is also a method for producing a battery module having a plurality of battery cells. The battery cells are in this case designed, in particular, as lithium-ion battery cells. In addition, the battery cells are each electrically conductively interconnected with one another in series and/or in parallel.

In this case, a first connecting element of electrically conductive design is electrically conductively connected to a first terminal of a switching device and a voltage tap of a battery cell arranged at an end.

In this case, a second connecting element of electrically conductive design is electrically conductively connected to a second terminal of the switching device and a voltage tap of the battery module.

The first connecting element and/or the second connecting element are furthermore received in a thermally conductive manner in a receptacle of the housing of the battery module.

In particular, the method is a method for producing an inventive battery module that has just been described so that the inventive method can also be developed for the advantageous developments described in relation to the inventive battery module.

BRIEF DESCRIPTION OF THE DRAWINGS

Exemplary embodiments of the invention are illustrated in the drawings and are described in greater detail in the following description.

In the drawings.

DETAILED DESCRIPTION

Figure 1:
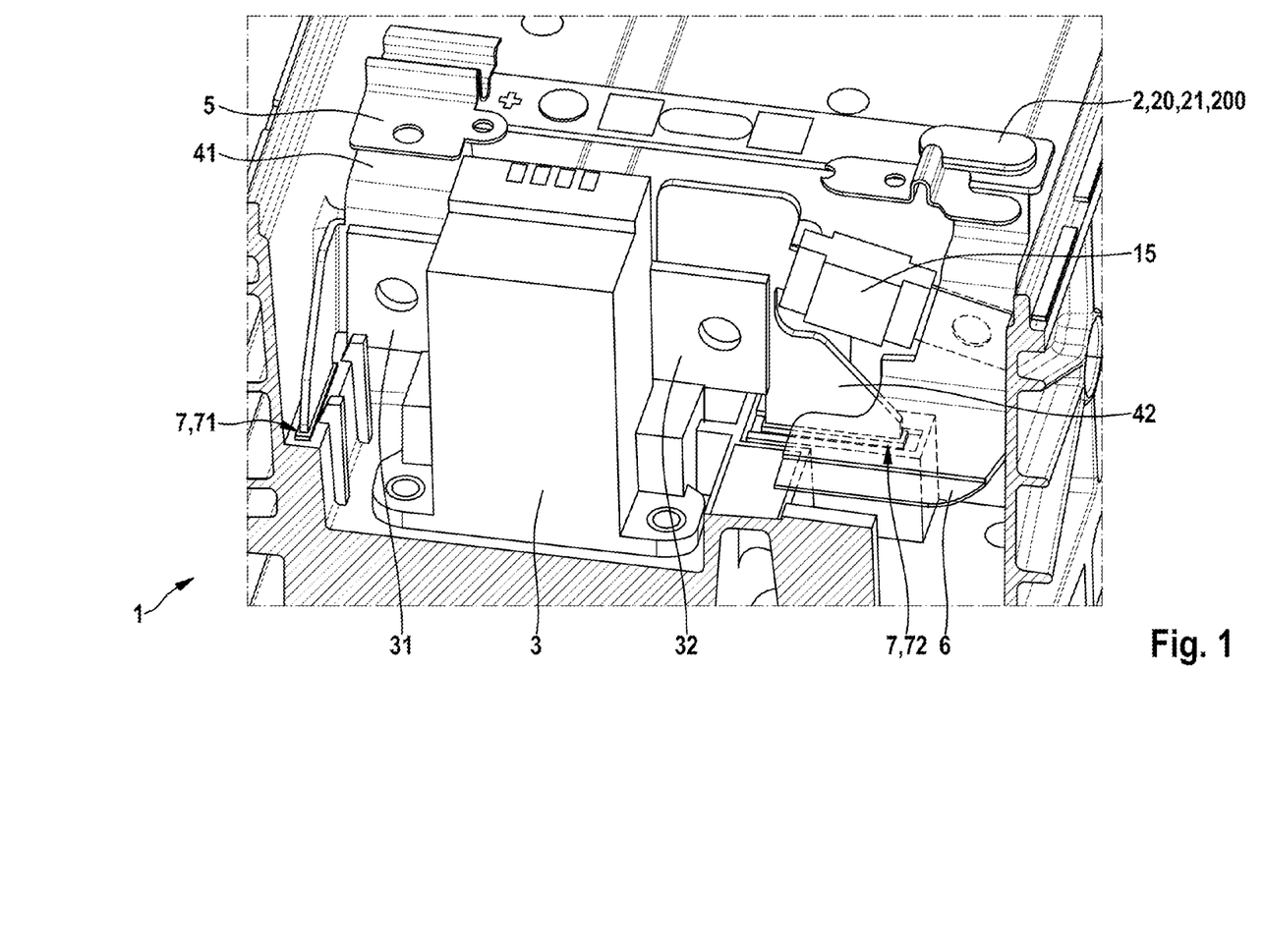
FIG. 1 shows a perspective view of a section of a first inventive embodiment of a battery module.

FIG. 1 shows a perspective view of a section of a first inventive embodiment of a battery module 1.

The battery module 1 comprises a plurality of battery cells 2, of which one battery cell 2 is shown in FIG. 1 by way of example. The battery cells 2 are in this case designed, in particular, as lithium-ion battery cells 20. In addition, the battery cells 2 are designed as prismatic battery cells 200. The battery cell 2 that can be seen in FIG. 1 is in this case, in particular, a battery cell 21 arranged at an end.

In this case, the battery cells 2 are each electrically conductively interconnected with one another in series and/or in parallel.

The battery module 1 furthermore comprises a switching device 3. The switching device 3 has a first terminal 31 and a second terminal 32.

In addition, the battery module 1 comprises a first connecting element 41 and a second connecting element 42. The first connecting element 41 and the second connecting element 42 are in this case each of electrically conductive design.

The first connecting element 41 electrically conductively connects the first terminal 31 of the switching device 3 to a voltage tap 5 of the battery cell 21 arranged at an end.

The second connecting element 42 electrically conductively connects the second terminal 32 of the switching device 3 to a voltage tap 6 of the battery module 1.

The first connecting element 41 and the second connecting element 42 are in this case formed from copper or from aluminum or from a ceramic.

A housing 10 of the battery module 1 furthermore comprises receptacles 7. In particular, the battery module 1 has a first receptacle 71 and a second receptacle 72.

In this case, the first connecting element 41 is received in a thermally conductive manner in the first receptacle 71. Furthermore, the second connecting element 42 is received in a thermally conductive manner in the second receptacle 72.

The battery module 1 also comprises a fuse 15, which is arranged inside the second connecting element 42 between the second terminal 32 and the voltage tap 6 of the battery module 1. As an alternative, the fuse 15 could also be arranged between the second connecting element 42 and the voltage tap 6 of the battery module 1.

Figure 2A:
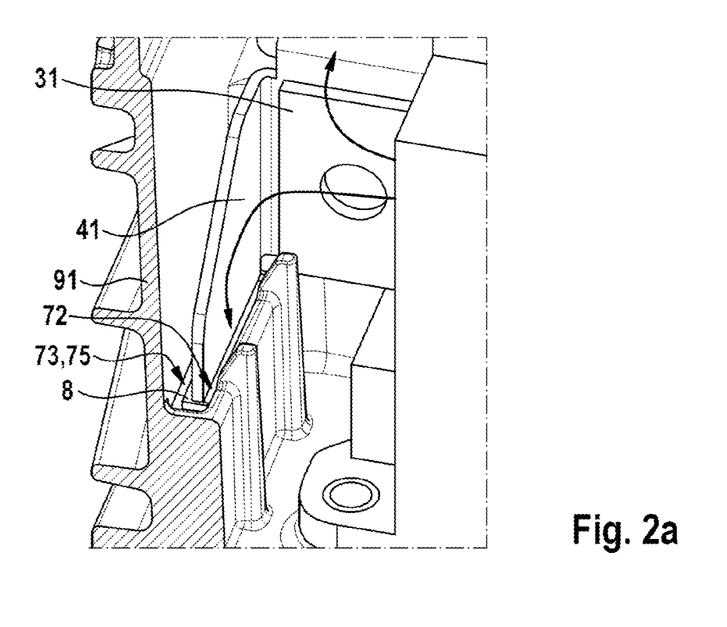
FIG. 2a shows a section of the first inventive embodiment of the battery module onto a first connecting element.

FIG. 2a shows a section of the first inventive embodiment of the battery module 1 onto a first connecting element 41.

In this case, the first receptacle 71 of the housing 10 of the battery module 1 can also be seen next to the first terminal 31 of the switching device 3 and the first connecting element 41.

It can also be seen that a compensation material 8 of thermally conductive design is arranged in the first receptacle 71.

The first receptacle 71 is formed in this case on a side surface 91 of the housing 10 of the battery module 1. The first receptacle 71 in this case has an opening 73, which has a cross-sectional area 75 that is arranged perpendicular to the side surface 91.

Figure 2B:
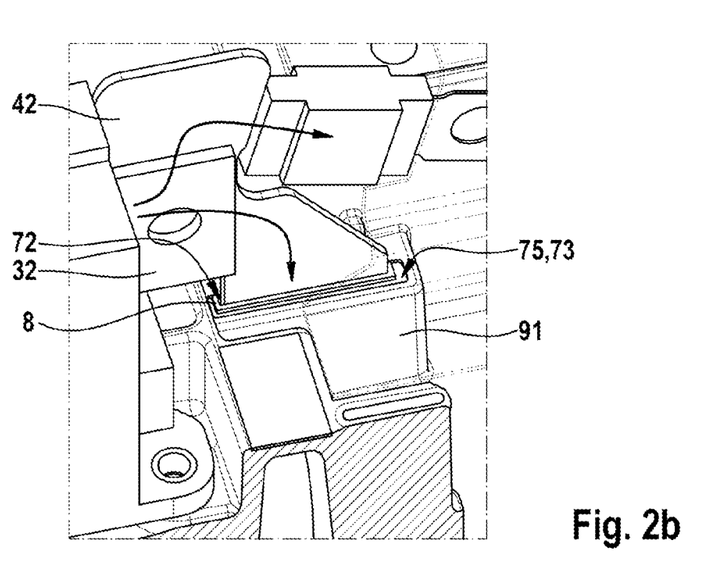
FIG. 2b shows a section of the first inventive embodiment of the battery module onto a second connecting element.

FIG. 2b shows a section of the first inventive embodiment of the battery module 1 onto a second connecting element 42.

In this case, the second receptacle 72 of the housing 10 of the battery module 1 can also be seen next to the second terminal 32 of the switching device 3 and the second connecting element 42.

It can furthermore be seen that a compensation material 8 of thermally conductive design is arranged in the second receptacle 72.

The second receptacle 72 is formed in this case on a side surface 91 of the housing 10 of the battery module 1. The second receptacle 72 in this case has an opening 73, which has a cross-sectional area 75 that is arranged perpendicular to the side surface 91.

Possible flows of heat when heat is removed from the switching device 3 are illustrated by the arrows both in FIG. 2a and in FIG. 2b.

Figure 3A:
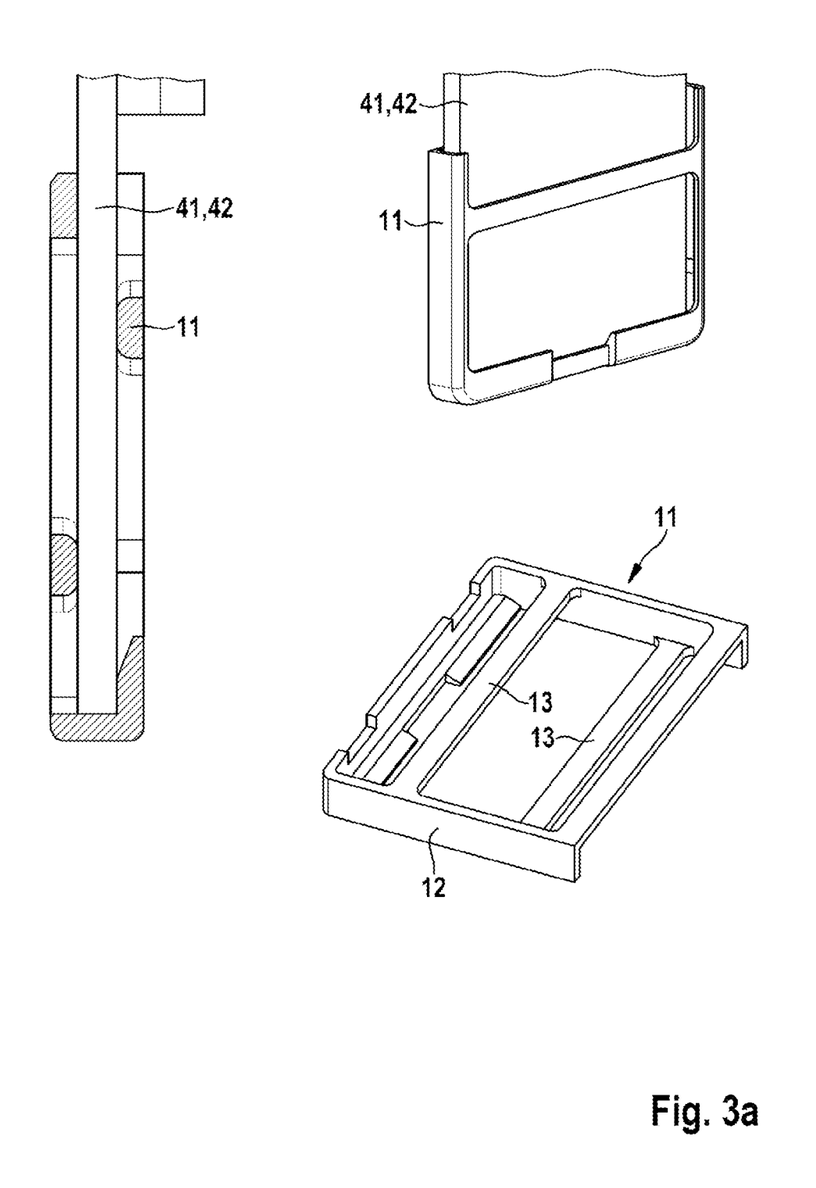
FIG. 3a shows an arrangement of a holding element.
Figure 3B:
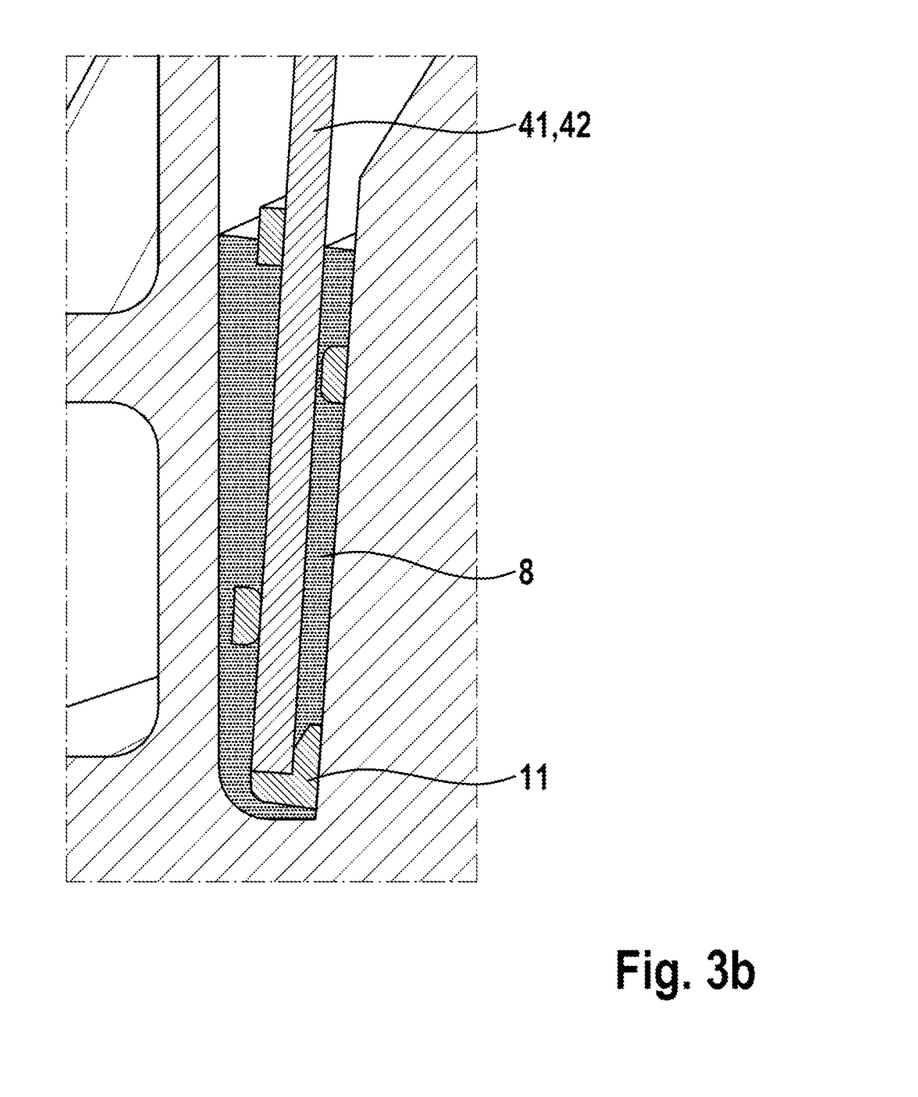
FIG. 3b shows a section of the first inventive embodiment of the battery module onto the holding element.

FIG. 3a shows an arrangement of a holding element 11 and FIG. 3b shows a section of the first inventive embodiment of the battery module 1 onto a holding element 11.

In FIG. 3a, the holding element 11 as such can first be seen here.

The arrangement of the holding element 11 on a first connecting element 41 or a second connecting element 42 can furthermore be seen in a perspective view and in a sectional view from the side.

In this case, the holding element 11 can be secured, for example, to the first connecting element 41 or the second connecting element 42 by means of a clip connection. The holding element 11 comprises, in particular, a frame 12, which at least partly surrounds the first connecting element 41 or the second connecting element 42 on longitudinal edges and on a bottom edge. The holding element 11 also comprises spacer elements 13, which serve to form a spacing between the first connecting element 41 or the second connecting element 42 and the respective receptacle 7, 71, 72.

In FIG. 3b, an arrangement of the first connecting element 41 or the second connecting element 42 and the holding element 11 in the receptacle 7 can be seen. It can be seen here that the holding element 11 or the spacer elements 13 produce such a spacing that the compensation element 8 can be received within the receptacle 7 between the first connecting element 41 or the second connecting element 42 and the receptacle 7. In order to obtain an optimal connection by way of the compensation material 8, the first connecting element 41 or the second connecting element 42 and also the holding element 11 can be adapted to the receptacle 7. Efficient heat dissipation can be provided as a result.

Figure 4:
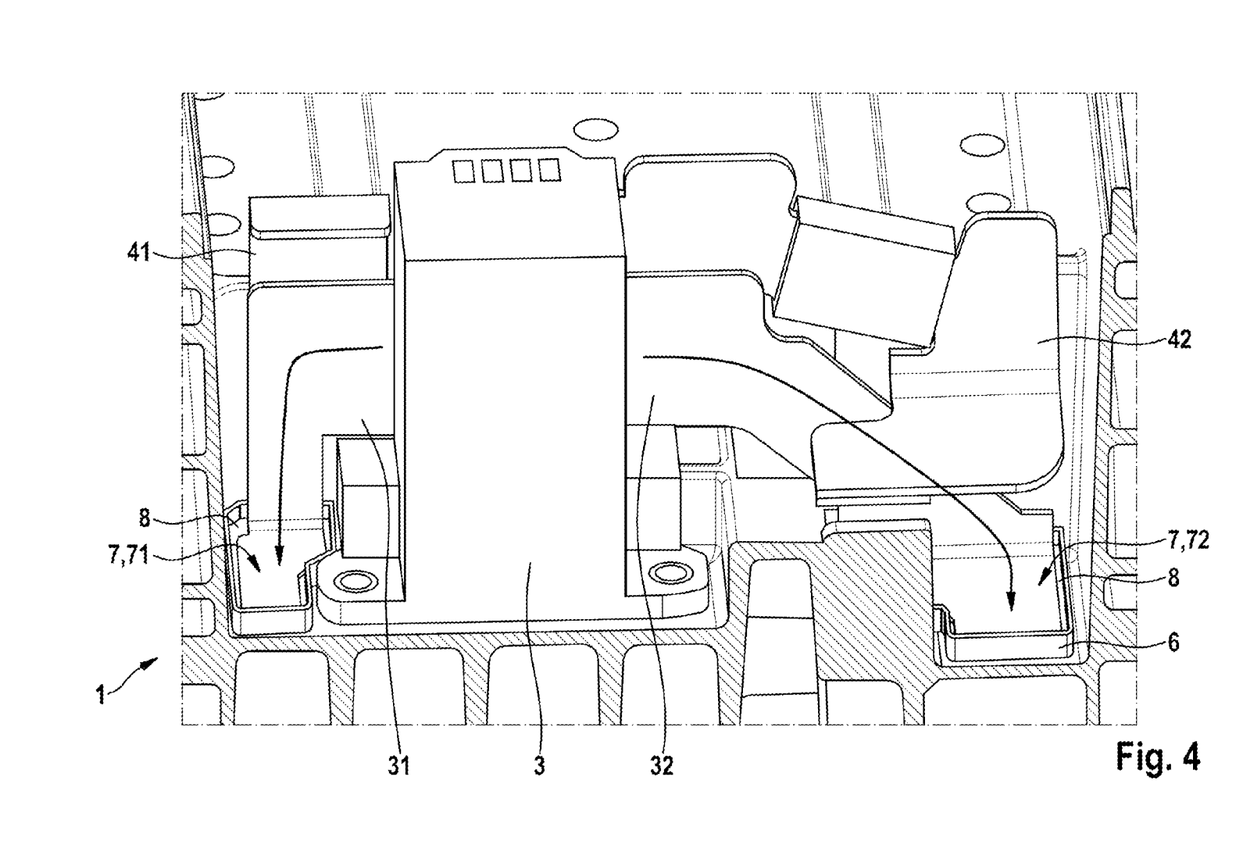
FIG. 4 shows a perspective view of a section of a second inventive embodiment of a battery module.

FIG. 4 shows a perspective view of a section of a second inventive embodiment of a battery module 1.

The second embodiment of the battery module 1 shown in FIG. 4 substantially corresponds to the first embodiment of the battery module 1 that has already been described. One difference, for example, consists in the thermally conductive reception between the first connecting element 41 in the first receptacle 71 and in the thermally conductive reception of the second connecting element 42 in the second receptacle 72.

In this case, in the second embodiment of the battery module 1, the housing 10 of the battery module 1 also comprises receptacles 7. In particular, the battery module 1 has a first receptacle 71 and a second receptacle 72.

In this case, the first connecting element 41 is received in a thermally conductive manner in the first receptacle 71. Furthermore, the second connecting element 42 is received in a thermally conductive manner in the second receptacle 72.

In FIG. 4, possible flows of heat in the case of removal of heat are illustrated by the arrows.

Figure 5:
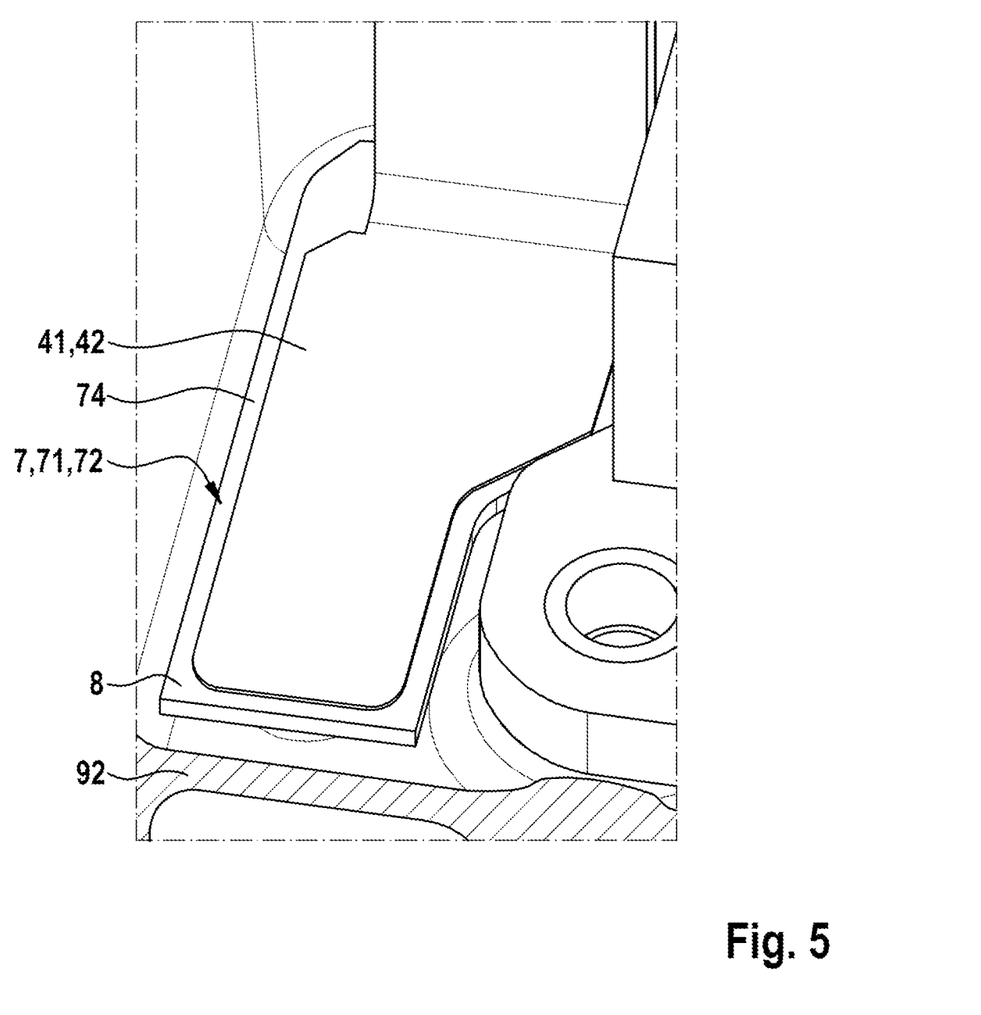
FIG. 5 shows a section of the second inventive embodiment of the battery module onto a connecting element and FIG. 6a shows a holding element.

FIG. 5 shows a section of the second inventive embodiment of the battery module 1 onto a first connecting element 41 or a second connecting element 42.

In this case, the receptacle 7, or the first receptacle 71 or the second receptacle 72 can furthermore be seen.

The receptacle 7 is formed in this case on a bottom surface 92 of the housing 10 of the battery module 1. The receptacle 7 in this case has an opening 74, which has a cross-sectional area 76 that is arranged parallel to the bottom surface 92.

It can furthermore be seen that a compensation material 8 of thermally conductive design is arranged in the second receptacle 72.

Figure 6A:
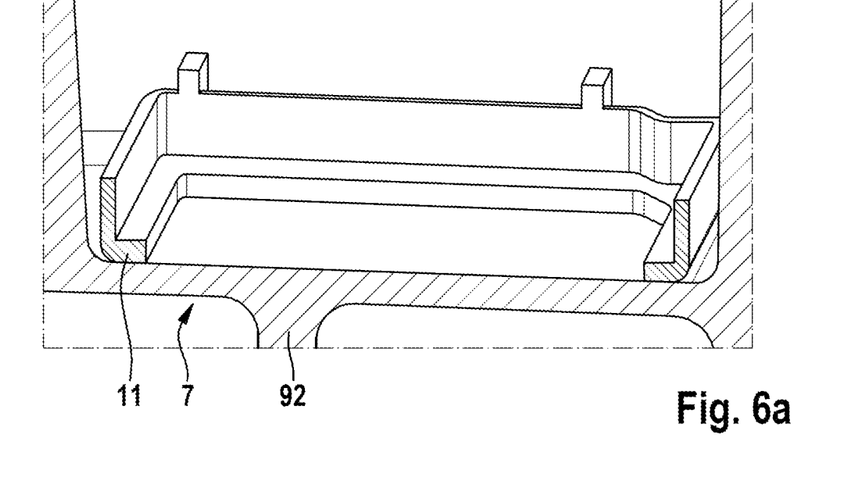
Figure 6B:
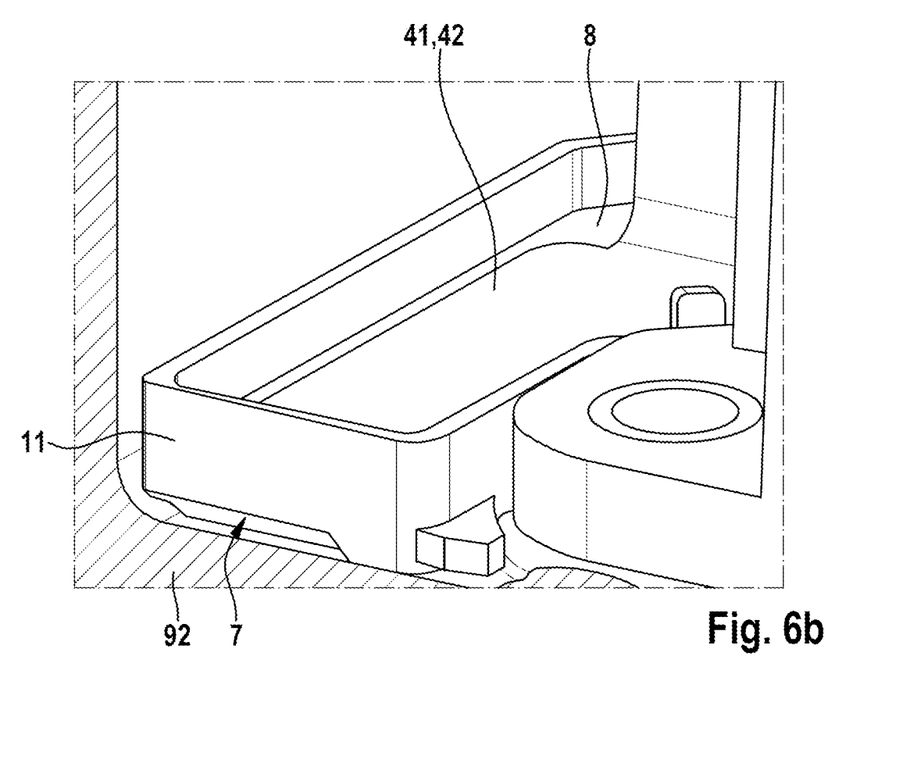
FIG. 6b shows a section of the second inventive embodiment of the battery module onto the holding element.

FIG. 6a shows a holding element 11 and FIG. 6b shows a section of the second inventive embodiment of the battery module 1 onto a holding element 11.

In this case, first the holding element 11 can be seen on the bottom surface 92 of the housing 10 of the battery module 1, and specifically before the first connecting element 41 or the second connecting element 42 has been arranged. In this case, the holding element 11 can be formed from a polymeric material. For example, the holding element 11 in FIG. 6a may have ribs, which cannot be seen and which serve to center the holding element 11 in the receptacle 7 of the housing 10 of the battery module 1. Such ribs enable alignment and enable, in particular, simplified assembly.

FIG. 6b shows that the first connecting element 41 or the second connecting element 42 is arranged in the receptacle 7. In particular, the first connecting element 41 or the second connecting element 42 is received in the holding element 11. The compensation element 8 can furthermore be seen.

The holding element 11 serves, in particular, for reliable electrical insulation of the first connecting element 41 or the second connecting element 42 from the receptacle 7.

What is claimed is:

1. A battery module having
a plurality of prismatic battery cells (2), which are each electrically conductively interconnected with one another in series and/or in parallel, and
a switching device (3) arranged immediately adjacent to a terminal battery cell, and which has a first terminal (31) and a second terminal (32), wherein
a first connecting element (41) of electrically conductive design electrically conductively connects the first terminal (31) to a first voltage tap (5) of a battery cell (2, 21) arranged at an end and
a second connecting element (42) of electrically conductive design electrically conductively connects the second terminal (32) to a second voltage tap (6) of the battery module (1),
wherein the first connecting element (41) is received in a thermally conductive manner in a receptacle (7, 71) of a housing (10) of the battery module (1),
wherein the first connecting element (41) includes a first portion engaging the first terminal (31), a second portion spaced from the first portion, the second portion engaging the first voltage tap (5), and a fin portion received in the receptacle (7, 71), such that heat from the first voltage tap (5) of the battery module (1) and heat from the first terminal (31) is transmitted through the first connecting element (41) and into the receptacle (7, 71).

2. The battery module according to claim 1, wherein a compensation material (8) of thermally conductive design is received in the receptacle (7).

3. The battery module according to claim 1, wherein the receptacle (7) is formed on a side surface (91) of the housing (10) of the battery module (1) or the receptacle (7) is formed on a bottom surface (92) of the housing (10) of the battery module (1).

4. The battery module according to claim 3, wherein the receptacle (7) has an opening (73, 74) having a cross-sectional area (75, 76) arranged perpendicular to the side surface (91) or parallel to the bottom surface (92).

5. The battery module according to claim 1, wherein the battery module (1) furthermore comprises a holding element (11), which is arranged between the receptacle (7) and the first connecting element (41) or between the receptacle (7) and the second connecting element (42).

6. The battery module according to claim 1, wherein the first connecting element (41) and the second connecting element (42) are formed from a material selected from copper or aluminum or ceramic.

7. The battery module according to claim 1, wherein the housing (10) of the battery module (1) comprises a temperature-control element.

8. The battery module according to claim 7, wherein the receptacle (7) is arranged immediately adjacent to the temperature-control element.

9. The battery module according to claim 1, wherein battery cells are lithium-ion battery cells (20).

10. A method for producing a battery module having a plurality of prismatically formed battery cells (2), which are each electrically conductively interconnected with one another in series and/or in parallel,
wherein a first connecting element (41) of electrically conductive design is electrically conductively connected to a first terminal (31) of a switching device (3) and a first voltage tap (5) of a battery cell (2, 21) arranged at an end, and
wherein a second connecting element (42) of electrically conductive design is electrically conductively connected to a second terminal (32) of the switching device (3) and a second voltage tap (6) of the battery module (1), the switching device (3) being arranged immediately adjacent to a terminal battery cell,
wherein the first connecting element (41) is received in a thermally conductive manner in a receptacle (7, 71) of a housing (10) of the battery module (1),
wherein the first connecting element (41) includes a first portion engaging the first terminal (31), a second portion spaced from the first portion, the second portion engaging the first voltage tap (5), and a fin portion received in the receptacle (7, 71), such that heat from the first voltage tap (5) of the battery module (1) and heat from the first terminal (31) is transmitted through the first connecting element (41) and into the receptacle (7, 71).

11. The method according to claim 10, wherein the battery cells are lithium-ion battery cells (20).

12. The battery module according to claim 1, wherein the receptacle (7, 71) is a recess formed in a wall of the housing (10).

13. The method according to claim 10, wherein the receptacle (7, 71) is a recess formed in a wall of the housing (10).

14. The battery module according to claim 4, wherein the fin portion of the first connecting element (41) is configured to be received in the opening (73) of the receptacle (7, 71).

15. The battery module according to claim 1, wherein the first portion of the first connecting element (41) lies in a first plane, wherein the first terminal (31) is parallel to the first plane, and wherein the second portion of the first connecting element (41) lies in a second plane generally perpendicular to the first plane.

16. The battery module according to claim 15, wherein the fin portion of the first connecting element (41) lies in a third plane, wherein the third plane is generally perpendicular to the first plane and the second plane.

17. The method according to claim 10, wherein the fin portion of the first connecting element (41) is configured to be received in an opening (73) of the receptacle (7, 71).

18. The method according to claim 10, wherein the first portion of the first connecting element (41) lies in a first plane, wherein the first terminal (31) is parallel to the first plane, and wherein the second portion of the first connecting element (41) lies in a second plane generally perpendicular to the first plane.

19. The method according to claim 18, wherein the fin portion of the first connecting element (41) lies in a third plane, wherein the third plane is generally perpendicular to the first plane and the second plane.

\* \* \* \* \*